US005623227A

United States Patent [19]
Everline et al.

[11] Patent Number: 5,623,227
[45] Date of Patent: Apr. 22, 1997

[54] AMPLIFIER CIRCUIT AND METHOD OF CONTROLLING AN AMPLIFIER FOR USE IN A RADIO FREQUENCY COMMUNICATION SYSTEM

[75] Inventors: Paul Everline, Wildwood; Mark Obermann, Niles, both of Ill.

[73] Assignee: Motorola, Inc., Schaumburg, Ill.

[21] Appl. No.: 544,049

[22] Filed: Oct. 17, 1995

[51] Int. Cl.$^6$ ........................................................ H03F 1/32
[52] U.S. Cl. ................................................ 330/2; 330/151
[58] Field of Search .................................. 330/149, 151, 330/2; 375/297; 455/63

[56] References Cited

U.S. PATENT DOCUMENTS

| | | |
|---|---|---|
| 3,471,798 | 10/1969 | Seidel . |
| 3,649,927 | 3/1972 | Seidel . |
| 3,755,754 | 8/1973 | Putz . |
| 3,815,040 | 6/1974 | Seidel . |
| 3,873,936 | 3/1975 | Cho . |
| 3,922,617 | 11/1975 | Denniston et al. . |
| 3,993,961 | 11/1976 | Narayanan . |
| 4,458,209 | 7/1984 | Miller et al. . |
| 4,517,521 | 5/1985 | Preschutti et al. . |
| 4,560,945 | 12/1985 | Olver ................................ 330/151 X |
| 4,580,105 | 4/1986 | Myer . |
| 4,583,049 | 4/1986 | Powell . |
| 4,629,996 | 12/1986 | Watanabe et al. . |
| 4,636,741 | 1/1987 | Mitzlaff . |
| 4,717,884 | 1/1988 | Mitzlaff . |
| 4,879,519 | 11/1989 | Myer . |
| 4,885,551 | 12/1989 | Myer . |
| 4,926,136 | 5/1990 | Olver . |
| 5,023,565 | 6/1991 | Lieu . |
| 5,077,532 | 12/1991 | Obermann et al. . |
| 5,130,663 | 7/1992 | Tattersall, Jr. . |
| 5,155,448 | 10/1992 | Powell . |
| 5,157,346 | 10/1992 | Powell et al. . |
| 5,307,022 | 4/1994 | Tattersall et al. . |
| 5,307,512 | 4/1994 | Mitzlaff . |
| 5,323,119 | 6/1994 | Powell et al. . |
| 5,349,300 | 9/1994 | Matz et al. . |
| 5,386,198 | 1/1995 | Ripstrand et al. . |
| 5,444,418 | 8/1995 | Mitzlaff . |

OTHER PUBLICATIONS

"Feedforward—an alternative approach to amplifier linearization", T. J. Bennett, and R. F. Clements, The Radio and Electronic Engineer, vol. 44, No. 5, May 1974, pp. 257–262.
A Microwave Feed–Forward Experiment, H. Seidel, The Bell System Technical Journal, vol. 50, No. 9, Nov. 1971.
Analog Reflection Topology Building Blocks for Adaptive Microwave Signal Processing Applications, Lucyszyn and Robertson, IEEE, vol. 43, No. 3, Mar. 1995, pp. 601–611.
Application to Federal Communications Commission for Equipment Authorization by Motorola, Inc.; FCC ID IHEC5UX1; File #31010/EQU 17.9, Dec. 9, 1994.
Application to Federal Communications Commission for Equipment Authorization by Motorola, Inc.; FCC ID IHEC5UJ1; File #31010/EQU 17.9, May 16, 1995.
Application to Federal Communications Commission for Equipment Authorization by Motorola, Inc.; FCC ID IHEC5SH1; File #31010/EQU 17.9 May 5, 1992.

Primary Examiner—James B. Mulllins
Attorney, Agent, or Firm—Donna Rogers Maddox

[57] ABSTRACT

An amplifier circuit (100) for use in a radio frequency system. The circuit is comprised of a first amplifier (22) having a first input (20) receiving a first signal (16) and a first output (24). A first coupler (18) samples the first input (20) of the first amplifier (22) and a second coupler (26) samples the first output (24) of the first amplifier (22). A third coupler (36) then compares an output of the second coupler (28) and an output of the first coupler (34), producing an error signal (38) which is substantially indicative of the difference between the first input (20) and the first output (24). A fourth coupler (44) combines the error signal (38) with a second signal (48) to produce a composite signal (50), the second signal (48) at least partially correlated with the first signal (16) received by the first input (20) of the first amplifier. A second amplifier (52) is responsive to the composite signal (50) and produces a second output (54).

20 Claims, 5 Drawing Sheets

AMPLIFIER CIRCUIT AND METHOD OF CONTROLLING AN AMPLIFIER FOR USE IN A RADIO FREQUENCY COMMUNICATION SYSTEM

FIELD OF THE INVENTION

This invention relates generally to amplifier circuits, and more particularly to amplifier circuits for use in a radio frequency communication system.

BACKGROUND OF THE INVENTION

Conventional feed-forward amplifiers can be generally placed into various categories identified as types I, II, and III, based on the way a desired signal and error signal are distributed through a various amplifiers and couplers comprising a feed-forward loop. A conventional type I feed-forward amplifier achieves a high degree of intermodulation (IM) reduction, typically about 20 dB, but has poor efficiency. Traditional type I feed-forward amplifiers only have an efficiency of about 5% which leads to high operating costs.

Conventional type II feed-forward amplifiers have improved efficiency compared to type I amplifiers, but type II amplifiers have a drawback of limited IM reduction. Also, conventional type II amplifiers reduce system gain, typically about 4 dB. Type III feed-forward amplifiers offer a compromise between efficiency and IM improvement (about 20 dB), but with further reduced system gain of about 7 dB. In addition, due to the complexity of type III feed-forward amplifiers, it is difficult to control these amplifiers to achieve optimum IM reduction.

Accordingly, there is a need for an improved amplifier circuit that provides improved efficiency, easier control, and IM reduction without undesirably reducing system gain. Further, there is a need for an improved method of controlling feed-forward amplifiers.

SUMMARY OF THE INVENTION

One aspect of the invention involves an amplifier circuit for use in a radio frequency system. The circuit is comprised of a first amplifier having a first input receiving a first signal and a first output. A first coupler samples the first input of the first amplifier and a second coupler samples the first output of the first amplifier. A third coupler is responsive to an output of the second coupler and an output of the first coupler. The third coupler produces an error signal which is substantially indicative of the difference between the first input and the first output. A fourth coupler combines the error signal with a second signal to produce a composite signal. The second signal is at least partially correlated with the first signal received by the first input of the first amplifier. A second amplifier is responsive to the composite signal and produces a second output.

A second aspect of the invention concerns a circuit comprised of a first amplifier having a first input and a first output. A second amplifier is responsive to the first output of the first amplifier. The second amplifier has a second input receiving a first signal and also has a second output. A first coupler samples the second input of the second amplifier and a second coupler samples the second output of the second amplifier. A third coupler responsive to an output of the second coupler and responsive to an output of the first coupler produces an error signal which is substantially indicative of the difference between the second input and the second output. A fourth coupler samples the first output of the first amplifier. A fifth coupler responsive to the fourth coupler and the error signal produces a composite signal. The composite signal is passed to a sixth coupler which is also responsive to the second output of the second amplifier.

A combination of the first two aspects of the invention produces another aspect in which the distortion level of an amplifier and preamplifier is reduced using a feed-forward correction network. A method of reducing errors in the amplifier includes a preamplifier injecting a split signal to parallel amplifiers. A sample of the input and output of one of the parallel amplifiers is compared to generate an error signal. This signal is injected at the input of the second parallel amplifier at such a level as to predistort the second amplifier. The level of this error signal is further set such that when the parallel amplifiers recombine, the error generated from the first of the parallel amplifiers is substantially reduced and the error introduced by the preamplifier is also significantly reduced.

Another aspect of this invention involves a method of controlling the above described amplifier circuits. The method includes the following steps:

(a) taking a plurality of signal strength measurements, each measurement taken at a different frequency within a measured frequency band;

(b) comparing each measurement with a predetermined threshold value;

(c) discarding measurements that exceed the threshold;

(d) selecting a first maximum measured value by picking a highest measured value from the remaining measurements; and (e) adjusting an amplitude and phase adjustment circuit coupled to an amplifier circuit based on the first maximum measured value.

The invention itself, together with its intended advantages will best be understood by reference to the following detailed description, taken in conjunction with the accompanying drawings.

DETAILED DESCRIPTION OF THE PREFERRED EMBODIMENTS

Figure 1:
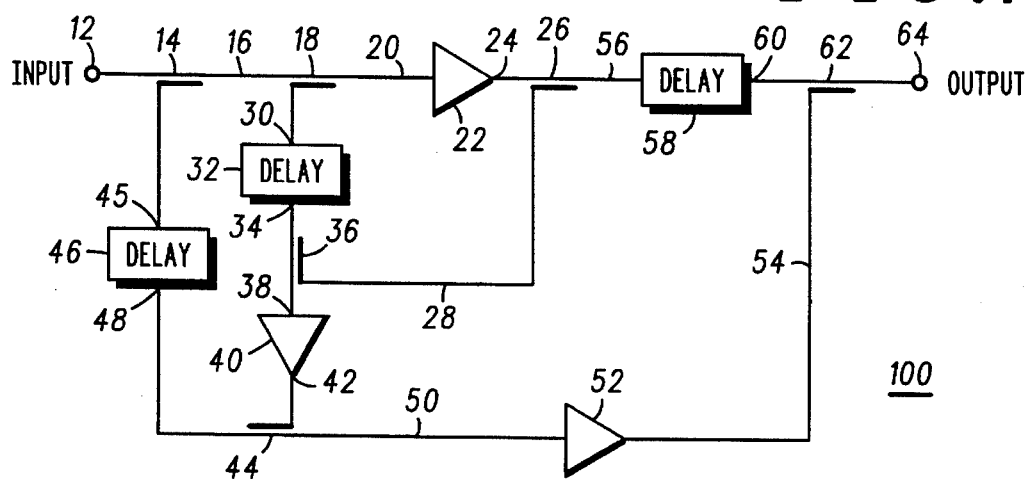
FIGS. 1–4 are block circuit diagrams of preferred embodiments of amplifier configurations.

A preferred embodiment of the invention is shown in FIG. 1. An amplifier 40, a delay 32, and couplers 18, 26 and 36 comprise a circuit capable of extracting an error signal generated in an amplifier 22 and re-injecting that error signal at the proper level at a coupler 44. This allows the error signal to be injected at coupler 44 independent of a component of an input signal 12.

An amplifier pair of the amplifier 22 and an amplifier 52 as well as a coupler 14 and a coupler 62 form a parallel amplifier network. In this case, coupler 14 and coupler 62 are 90° 3 dB couplers, splitting the power between the amplifiers 22 and 52 and then recombining the outputs of amplifiers 22 and 52 for combined power at an output 64.

In the circuit of FIG. 1, a signal 12 is passed through coupler 14 and produces a signal 16 and a signal 45. In the preferred embodiment, these signals 16, 45 are substantially similar in amplitude and have an approximately 90° phase difference. The signal 16 is passed through coupler 18 producing a sample of signal 16 as signal 30 and an input 20 to amplifier 22. The signal 30 passes through the delay 32 to produce a signal 34. The signal 34 then provides a signal comprised of a component of input signal 12. The component of the input signal 12 will hereafter be referred to as the desired signal component. The signal 20 passes through amplifier 22 which produces a composite signal 24 of the desired signal component and an error signal generated in amplifier 22. The error signal generated in amplifier 22 will hereafter be referred to as the first error signal. A coupler 26 supplies a sample of the composite signal 24 as a signal 28. The signal 24 also passes through coupler 26 and a delay 58 to produce a signal 60 which is passed to coupler 62. The signal 60 is comprised of the desired signal component and the first error signal component.

The composite signal 28 is also comprised of the desired signal component and the first error signal component. The delay 32 is set such that the group delay from coupler 18 to coupler 36 through delay 32 is approximately equal to the group delay from coupler 18 to coupler 36 through amplifier 22 and coupler 26. The couplers 18, 26, and 36 and loss through delay 32 are set such that the desired signal component in signal 34 after it has passed through coupler 36 is substantially similar in amplitude and approximately 180° out of phase from the desired signal component of the composite signal 28 after it has passed through coupler 36. A resultant signal 38 is then generated as the desired signal components are substantially reduced by coupler 36 leaving the first error signal component. This resultant signal 38 is then amplified by amplifier 40 producing a signal 42 which is passed to coupler 44. The signal 45 is delayed through a delay 46 to produce a signal 48 which is also passed to coupler 44.

At this point, coupler 44 combines the signal 48 and the signal 42 to create a signal 50 which is comprised of the desired signal component and the first error signal component. The delay 46 is set such that the group delay from coupler 14 to coupler 44 through delay 46 is approximately equal to the group delay from coupler 14 to coupler 44 through coupler 18, delay 32, coupler 36 and amplifier 40 and such that the phase difference of the two paths is approximately zero. With the rest of the amplifier 100 configured as per the preferred embodiment, this aligns the first error signal component extracted at coupler 36 and passed through amplifier 40 such that feed-forward correction can occur at coupler 62.

The signal 50 is amplified by the amplifier 52 which produces a signal 54. The signal 54 is comprised of the desired signal component, the first error signal component, and an error signal generated in amplifier 52. The error signal generated in amplifier 52 will hereafter be referred to as the second error signal. Signal 54 is input to coupler 62.

In the preferred embodiment, the desired signal component present in signal 20 is substantially similar to the desired signal component present in signal 50. Also in the preferred embodiment, amplifier 22 and amplifier 52 are the same or substantially similar amplifiers. As such, the first error signal present in signal 24 is substantially similar to the second error signal present in signal 54. When the first error signal component is extracted at coupler 36 and passed through amplifier 40 and amplifier 52, it is approximately 180° out of phase with the second error signal present in signal 54.

The delay 58 is set such that when the desired signal component present in signal 60 passes through coupler 62, the amplitude is substantially similar and the phase is approximately equal with the desired signal component present in signal 54 after it has passed through the coupler 62. With this condition met, the first error signal component present in signal 60 after it has passed through coupler 62 is approximately 180° out of phase with the first error signal component present in signal 54 after it has passed through coupler 62.

In the preferred embodiment, the coupler 44 is set such that the amplitude of the first error signal component present in signal 42 is sufficient to substantially reduce the second error signal present in signal 54 as well as substantially reduce the first error signal component present in signal 60 after it has passed through coupler 62.

One benefit of this configuration is in the ease of construction of the parallel amplifier network. A second benefit is derived from the first error signal being injected at coupler 44 independent of the desired signal component. When controlling the overall amplifier, adjustments made to improve IM performance are substantially isolated from the power combining of the desired signal components through amplifiers 22 and 52.

Figure 2:
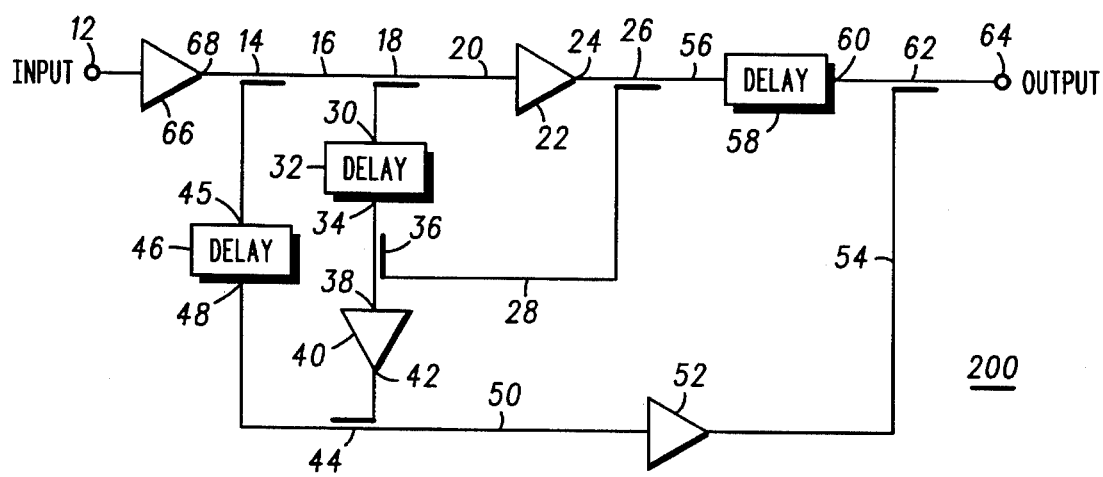

A third benefit from this configuration can be seen when a pre-amplifier 66 is added to the amplifier 100 in FIG. 1. This is shown in FIG. 2 and is a second embodiment of the invention. In most conventional feed-forward amplifiers, output IM performance is limited to the IM performance of amplifier 66. However by choosing amplifier 66 to have a transfer characteristic that is similar to the transfer characteristic of amplifier 22, the configuration of amplifier 200 offers an opportunity to correct for the error signal generated in amplifier 66. This error signal generated in amplifier 66 will hereafter be referred to as the initial error signal. The initial error signal propagates from the output of amplifier 66 through the entire amplifier 20 to a coupler 62. Since the transfer characteristics of amplifier 22 and amplifier 66 are similar, the error signals generated by these amplifiers will be substantially similar at the output of amplifier 200. Since this is the case in the preferred embodiment shown in FIG. 2, the component of the first error signal present in signal 50 can be adjusted to a higher level such that it will substantially reduce the initial error signal component present in signal 64. In this way, the amplifier 200 acts as a postdistortion correction mechanism for amplifier 66.

Figure 3:
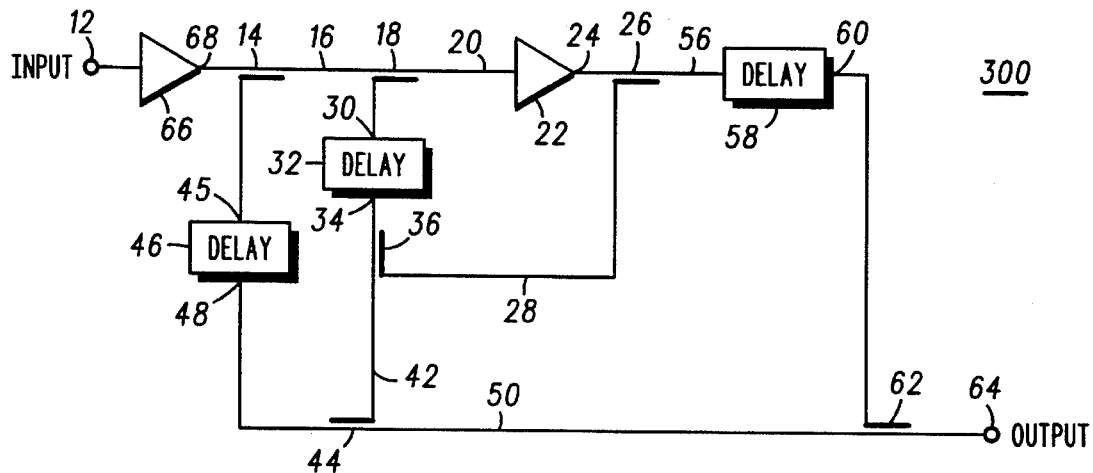

An alternative postdistortion correction circuit is shown in FIG. 3. In this circuit 300, since there is no amplifier 52, the amount of the first error signal component present in signal 42 injected at coupler 44 is the amount necessary to substantially reduce the first error signal component and the initial error signal component present in signal 64. The ability of this configuration 300 to correct the initial error signal is dependent on the similarity of the initial error signal and the first error signal. The closer the transfer functions of these amplifiers 66 and 22, the better the circuit 300 achieves postdistortion correction of amplifier 66.

Figure 4:
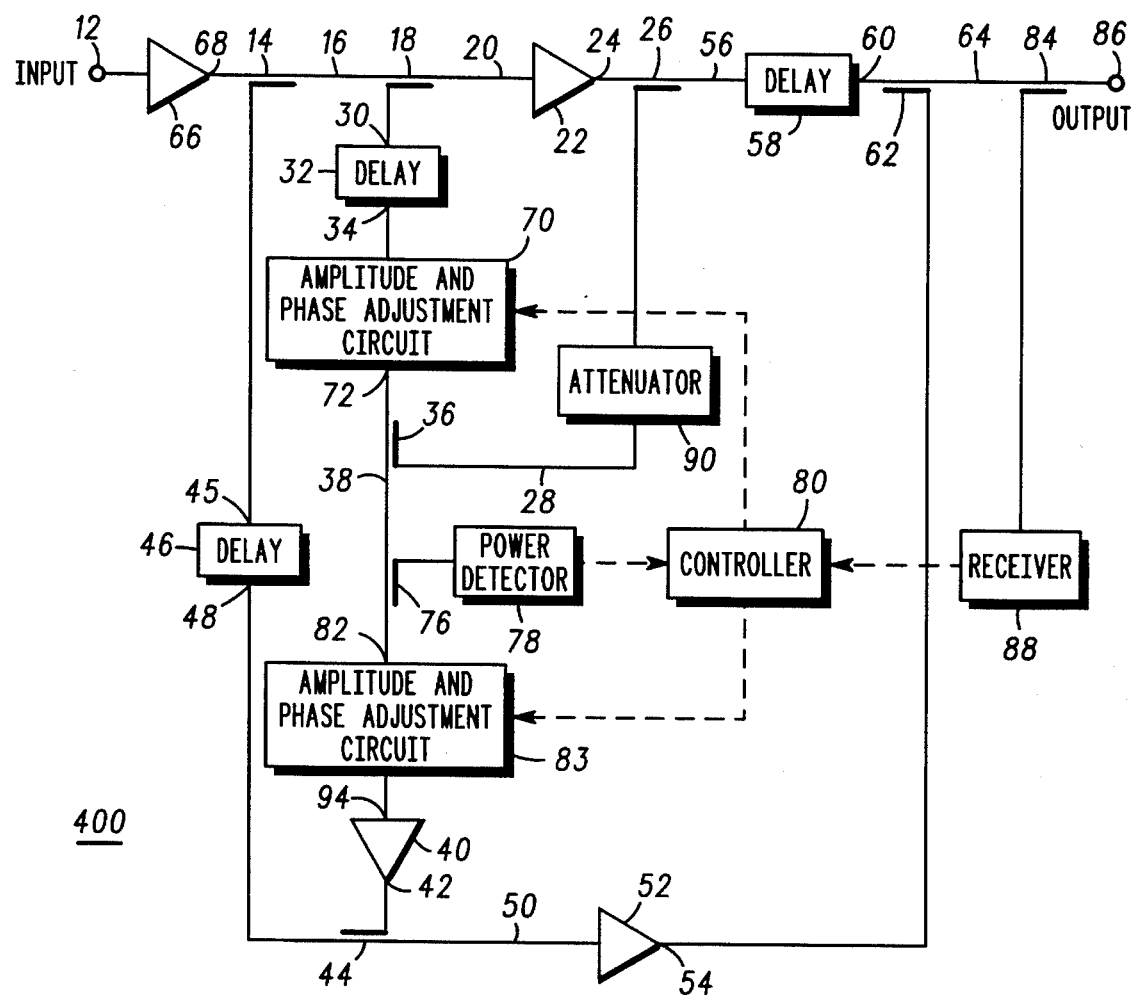

Another preferred embodiment of the invention is shown in FIG. 4. The amplifier shown, 400, is a feed-forward amplifier providing predistortion correction of amplifier 52, postdistortion correction of amplifier 66, and feed-forward correction of amplifier 22 using an active controller 80. The addition of amplitude and phase adjustment circuits 70 and 83, a power detector 78, a receiver 88, couplers 76 and 84, and controller 80 combine to provide a system that continuously monitors amplifier 400 and makes adjustments to keep amplifier 400 operating approximately near its optimal operating point.

An attenuator 90 is used to set the amplitude of the sampled signal 28 from coupler 26 so that the output of the attenuator 90 is a signal 92 which has a desired signal component with an amplitude substantially similar to the amplitude of the desired signal component contained in signal 72. An attenuation value is typically set such that the amplitude of the desired signal component in signal 92, when passed through a coupler 36, will be approximately in the center of an adjustable amplitude range of the desired signal component contained in signal 72 when it has passed through the amplitude and phase adjustment circuit 70 and through coupler 36. The amplitude of the desired signal component may be adjusted through the amplitude shifter in amplitude and phase adjustment circuit 70. The delay element 32 and phase shifter element contained in the amplitude and phase adjustment circuit 70 set the incoming signals to coupler 36 such that the desired signal components present in signals 72 and 92 are approximately 180° out of phase after passing through coupler 36. A coupler 76 is used to sample signal 38 and pass samples to the power detector 78. The power detector 78 in conjunction with the controller 80 adjust the amplitude and phase adjustment circuit 70 to minimize what remains of the canceled desired signal components present in signal 38.

An important point in the operation of amplifier 400 is in determining how much of the first error signal component present in signal 42 should be injected into coupler 44. Preferably, there should be sufficient signal present to substantially reduce the second error signal present in signal 54, as well as substantially reduce the first error signal component and the initial error signal component present in signal 64. The amount of the first error signal that is injected is determined by the controller 80 through information gathered from the receiver 88. Using this information, the amplitude and phase adjustment circuit 83 is adjusted for reduction of the error signals present in signal 64.

It should also be understood that the control of this feed-forward system preferably uses a method which is related directly to output distortion. Using such a control method, the preferred embodiment shown in FIG. 4 is easy to configure and is easy to control. A significant advantage of this amplifier 400 is the ability to use a more efficient preamplifier such as amplifier 66. In conventional feed-forward amplifiers, preamplifiers are typically less efficient amplifiers because the linearity of such an amplifier is generally needed to meet the overall linearity requirements of the amplifier 400. In the preferred embodiment, since postdistortion correction of amplifier 66 is configured along with the feed-forward correction of amplifier 22 and the predistortion correction of amplifier 52, the preamplifier 66 can be of a more efficient class, such as a class AB or class C amplifier, thereby improving the efficiency of the entire amplifier system 400. With the ability to post-distort correct amplifier 66, the preamplifier 66 may be any class amplifier except class A since class A amplifiers are not efficient.

To control amplifier 400, first, a reading is taken for the current settings of the amplitude and phase adjustment circuit 70. The phase shifter contained in amplitude and phase adjustment circuit 70 is then stepped in value and a new measurement is recorded. This new measurement is compared with the current measurement. If the new measurement is smaller than the current measurement, the phase shifter is left at the new setting and the process repeated. If the new measurement is greater than the current measurement, the phase shifter is returned to its previous setting, the stepping direction is reversed, and a change of direction is noted. The process is repeated until three direction changes have been recorded. The phase shifter contained in the amplitude and phase adjustment circuit 70 is then left at this setting and the amplitude shifter in the amplitude and phase adjustment circuit 70 is adjusted through a similar process. The above process is then repeated for amplitude and phase adjustment circuit 83 using a different measurement of interest. In this way, the amplitude and phase adjustment circuits 70 and 83 are set such that their measurement of interest are substantially reduced.

Figure 5:
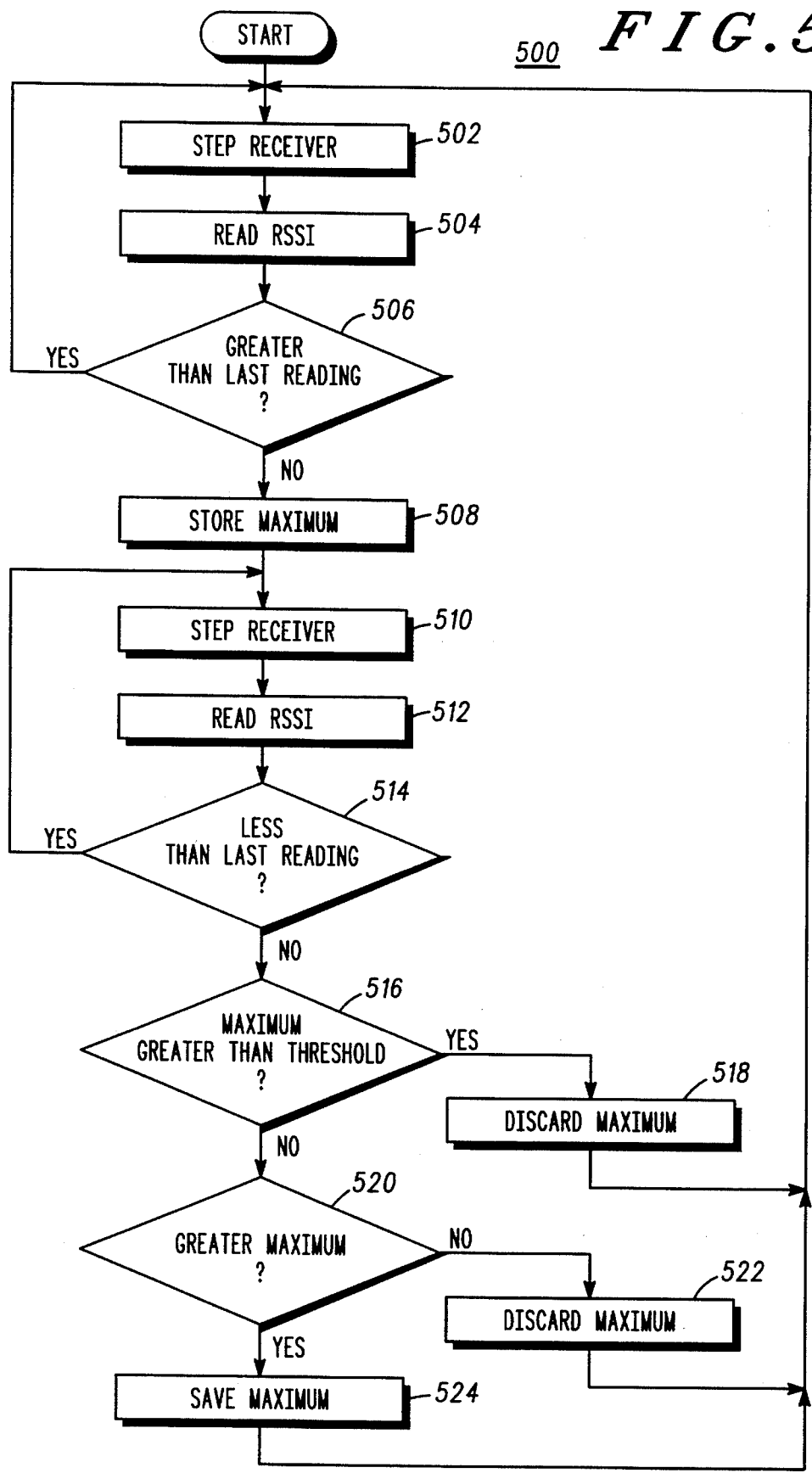
FIG. 5 is a flow chart of a preferred embodiment of a method of controlling an amplifier circuit.

For amplitude and phase adjustment circuit 70, the measurement of interest is the power measurement of power detector 78. For phase and gain adjustment circuit 83, the measurement, outlined in detail in FIG. 5, is related to the received signal strength indicator (RSSI) of receiver 88. For the measurement of interest for amplitude and phase adjustment circuit 83, the receiver 88 is first stepped, at 502. Next, at 504, a received signal strength indicator (RSSI) measurement is taken. At 506, a comparison is made between the current reading and a previous RSSI reading. If the current reading is greater than the last reading then processing continues back at 502. However if the current reading is not greater than the last reading then processing proceeds to step 508 where the current reading is stored as a maximum reading hereafter referred to as the new maximum.

Next, at 510 the receiver 88 is stepped again and another RSSI measurement is taken at 512. At 514, a comparison is made between the current RSSI reading and the last reading. If the current reading is less than the last reading then processing continues back at 510. However, if the current reading is not less than the last reading then a comparison is done, at 516, to determine whether the new maximum is greater than a predetermined threshold value. If so, then the new maximum is discarded at 518. However, if the new maximum is not greater than the threshold value, then processing continues at 520. At 520, a comparison is made between the new maximum against the greatest maximum recorded. If the new maximum is larger than the greatest maximum recorded, then the new maximum is saved at 524 as the greatest maximum. Otherwise, the new maximum is discarded at 522.

The above processing is continued until the receiver 88 has been stepped across the entire frequency band of interest. In this manner, the preferred method 500 locates the highest local maximum which does not exceed the predetermined threshold value. The controller 80, based on the greatest measured value which does not exceed the threshold, uses this information to adjust the amplitude and phase adjustment circuit 83 by attempting to minimize this local maximum RSSI value.

The amplitude and phase adjustment circuits 70 and 83 are periodically adjusted and compared against the maximum value as determined by the method described with reference to FIG. 5. In the preferred embodiment, the phase setting and amplitude setting of the amplitude and phase adjustment circuits 70 and 83 is adjusted in an attempt to minimize the measurements of interest.

Figure 6:
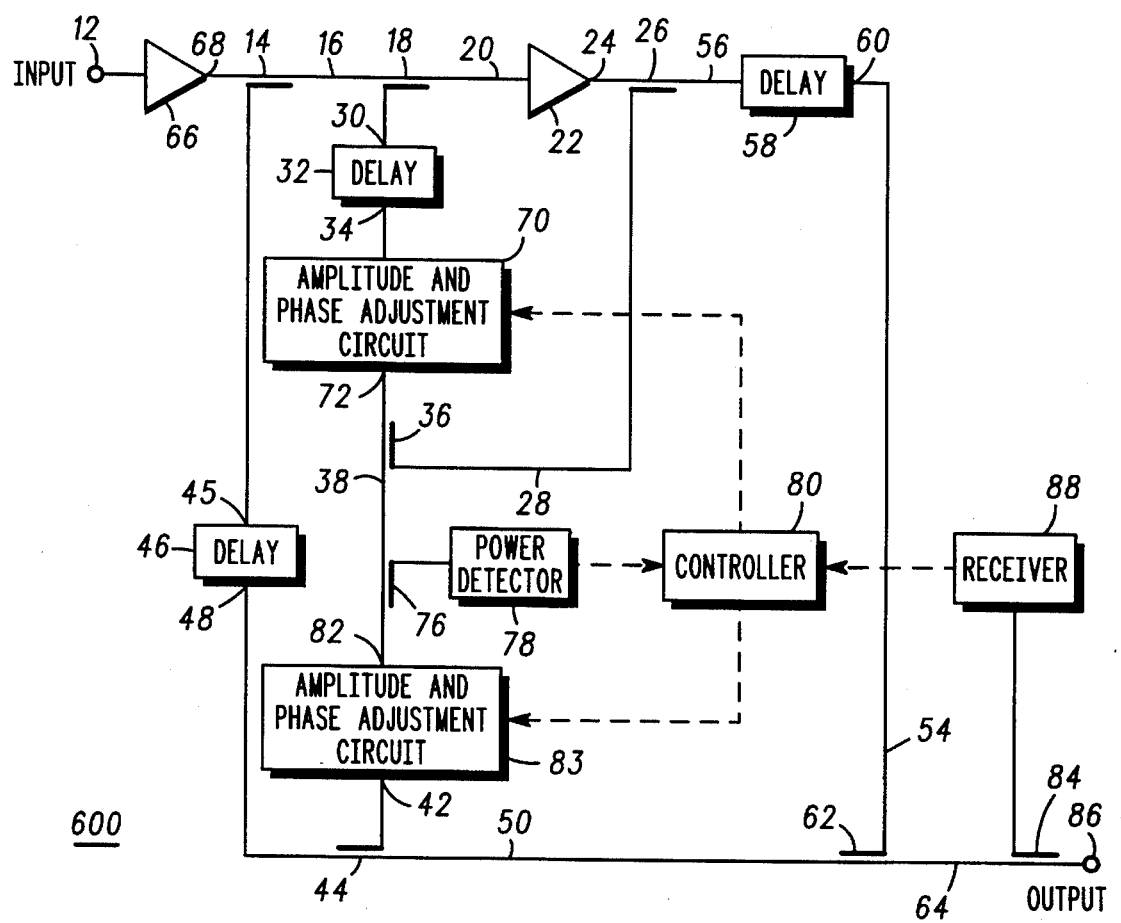
FIG. 6 is a block diagram of another preferred embodiment of an amplifier circuit.

The amplifier 300 configured as shown in FIG. 3 fixes all values for substantial correction at a desired operating condition. With the addition of a few components, active correction over many operating conditions can be achieved. One such example of this configuration is shown in FIG. 6.

The addition of the amplitude and phase adjustment circuits 70 and 83, the power detector 78, receiver 88, controller 80, and the addition of couplers 76 and 84 comprise a control system for the postdistortion correction amplifier.

This method of controlling a feed-forward amplifier circuit has many benefits. For example, it provides a control method which is directly responsive to the IM present at the output of the amplifier circuit 400 which takes advantage of the postdistortion correction configuration for amplifier 66 and the predistortion correction of amplifier 52. This method also provides a way of separating the distortion from the desired signal without storing large amounts of spectral information. This method also requires very little processing resources and can be applied to both the configuration shown in FIG. 2 and the configuration shown in FIG. 5.

Figure 7:
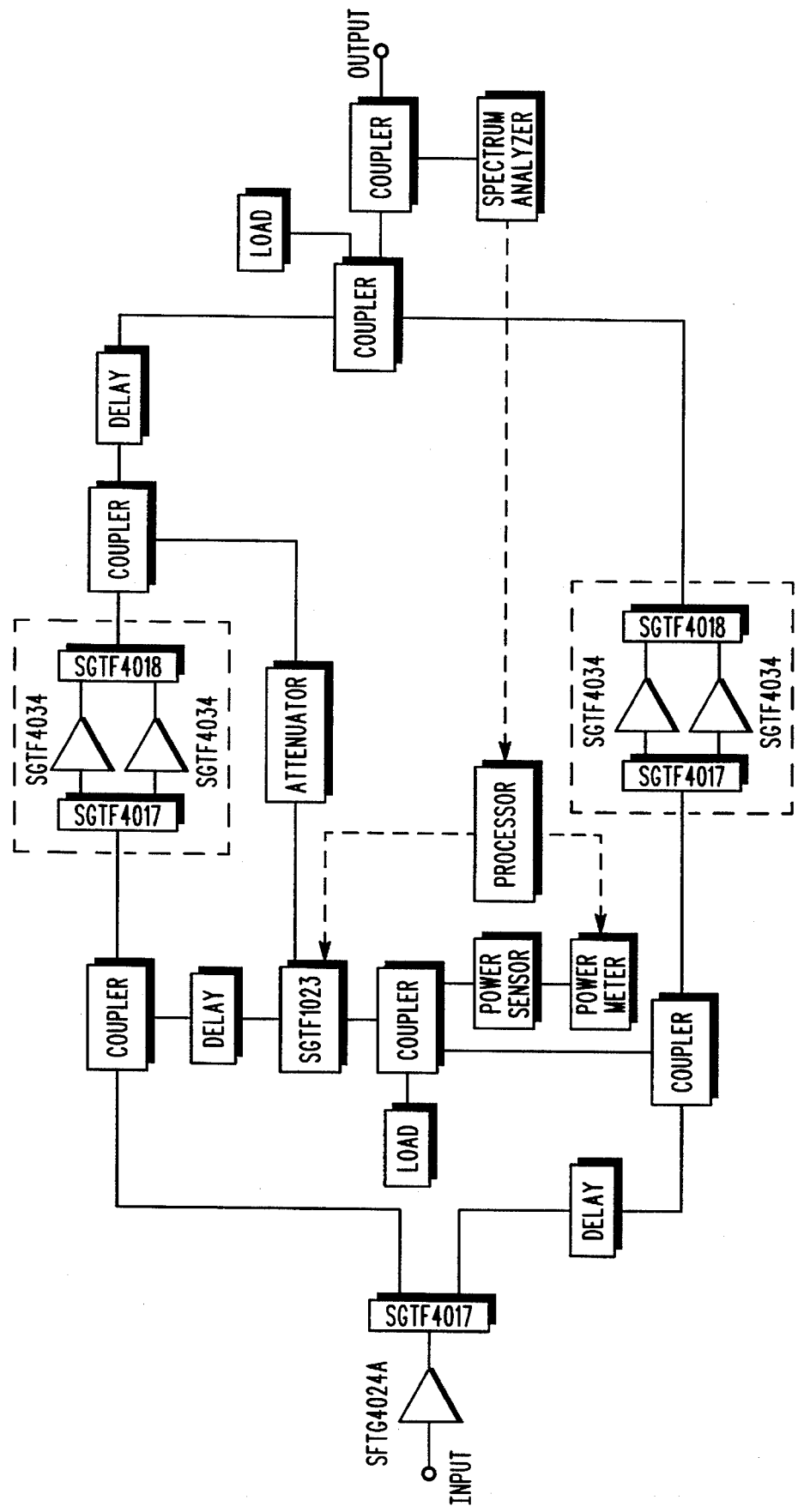
FIG. 7 is a more detailed schematic circuit diagram of a particular preferred amplifier circuit.

Another example of a particular embodiment is shown in FIG. 7. Further details regarding specific components is available by reference to the Motorola Supercell SC™ 9600 base station and by reference to "Linear Power Amplifier Equipment Description" available from Motorola, Inc., Cellular Publishing Services at 1501 W. Shure Drive, Arlington Heights, Ill. 60004.

Further advantages and modifications of the above described apparatus and method will readily occur to those skilled in the art. The invention, in its broader aspects, is therefore not limited to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What is claimed is:

1. An amplifier circuit for use in a radio frequency system, said circuit comprising:
   a first amplifier having a first input receiving a first signal and a first output;
   a first coupler sampling the first input of the first amplifier;
   a second coupler sampling the first output of the first amplifier;
   a third coupler responsive to an output of the second coupler and responsive to an output of the first coupler, said third coupler producing an error signal which is substantially indicative of the difference between the first input and the first output;
   a fourth coupler responsive to the input of the first amplifier and producing a second signal;
   a first delay circuit responsive to the fourth coupler, the first delay circuit receiving the second signal and producing a first delayed signal
   a fifth coupler responsive to the error signal and responsive to the first delayed signal and producing a composite signal; and
   a second amplifier having a second input that is responsive to the composite signal and having a second output.

2. The circuit of claim 1, further comprising a third amplifier which produces said first signal, said first and fourth couplers responsive to said third amplifier.

3. The circuit of claim 1, wherein said fourth coupler comprises a splitter.

4. The circuit of claim 3, further comprising a second delay circuit coupling said first coupler and said third coupler.

5. The circuit of claim 1, further comprising a sixth coupler responsive to the first output of the first amplifier and the second output of the second amplifier.

6. The circuit of claim 5, wherein the first output of the first amplifier is delayed prior to being coupled to said second output of said second amplifier by said sixth coupler.

7. The circuit of claim 1, further comprising a third amplifier responsive to said error signal and a fourth amplifier, said first input of said first amplifier being responsive to said fourth amplifier.

8. The circuit of claim 7, wherein at least one of said first, second and fourth amplifiers comprises an efficient amplifier.

9. The circuit of claim 1, further comprising a first amplitude and phase adjustment circuit and a second amplitude and phase adjustment circuit, wherein at least one of said couplers is responsive to said first amplitude and phase adjustment circuit and another of said couplers is responsive to said second amplitude and phase adjustment circuit.

10. The circuit of claim 9, further comprising a controller coupled to said first and second phase and gain adjustment circuits.

11. A method of adjusting an amplitude and phase adjustment circuit coupled to a feed-forward amplifier circuit, said method comprising the steps of:
   (a) taking a plurality of signal strength measurements, each measurement taken at a different frequency within a measured frequency band in order to determine a local maxima;
   (b) comparing the local maxima with a predetermined carrier threshold value;
   (c) discarding measurements that exceed the threshold;
   (d) selecting a first maximum measured value by picking a highest measured value from the remaining local maxima; and
   (e) adjusting the amplitude and phase adjustment circuit based on the first maximum measured value.

12. The method of claim 11, further comprising determining a second maximum measured value by repeating steps (a) through (c) above.

13. The method of claim 12, further comprising performing a second adjustment to the amplitude and phase adjustment circuit based on a comparison between the second maximum measured value with the first maximum measured value.

14. The method of claim 11, wherein said signal strength measurements comprise received signal strength indicator (RSSI) measurements.

15. The method of claim 11, wherein said feed-forward amplifier circuit comprises:
   a first amplifier having a first input receiving a first signal and a first output;
   a second amplifier having a second input and a second output;
   a first coupler sampling the first input of the first amplifier;
   a second coupler sampling the first output of the first amplifier;
   a third coupler subtracting an output of the second coupler from an output of the first coupler to produce an error signal;
   a third amplifier having a third input and a third output, said third input responsive to said error signal;
   a fourth coupler combining the third output of the third amplifier with a second signal, said second signal at least partially correlated with the first signal received by the first input of the first amplifier, said second input of said second amplifier being responsive to said fourth coupler; and a fifth coupler responsive to the first output of the first amplifier and the second output of the second amplifier.

16. An amplifier circuit for use in a radio frequency system, said amplifier circuit comprising:

a first amplifier having a first input and a first output, a second amplifier responsive to said first output of said first amplifier, said second amplifier having a second input receiving a first signal and a second output;

a first coupler sampling the second input;

a second coupler sampling the second output of the second amplifier;

a third coupler responsive to an output of the second coupler and responsive to an output of the first coupler, said third coupler producing an error signal which is substantially indicative of the difference between the second input and the second output;

a fourth coupler sampling the second input of the second amplifier;

a first delay circuit responsive to said fourth coupler, said first delay circuit delaying an output signal produced by said fourth coupler and producing a time delayed signal;

a fifth coupler combining said time delayed signal and said error signal to produce a composite signal;

a sixth coupler responsive to the second output of the second amplifier and responsive to the composite signal; and a third amplifier responsive to said fifth coupler.

17. The amplifier circuit of claim 16, wherein said sixth coupler is responsive to said third amplifier.

18. The amplifier of claim 16, further comprising a fourth amplifier responsive to said third coupler.

19. The amplifier circuit of claim 16, wherein said first amplifier comprises a preamplifier and said second amplifier comprises a main amplifier.

20. The circuit of claim 16, further comprising a first amplitude and phase adjustment circuit and a second amplitude and phase adjustment circuit, wherein at least one of said couplers is responsive to said first amplitude and phase adjustment circuit and another of said couplers is responsive to said second amplitude and phase adjustment circuit.

* * * * *